United States Patent
Smith et al.

(10) Patent No.: US 10,082,544 B2
(45) Date of Patent: Sep. 25, 2018

(54) SENSOR CONFIGURATION FOR A LATCH ASSEMBLY

(71) Applicant: D & D Group Pty Ltd, Frenchs Forest, New South Wales (AU)

(72) Inventors: Glenn Smith, Upper Duroby (AU); Klaus Peter Nink, Redcliffe (AU)

(73) Assignee: D & D Group Pty Ltd, Frenchs Forest, New South Wales (AU)

( * ) Notice: Subject to any disclaimer, the term of this patent is extended or adjusted under 35 U.S.C. 154(b) by 358 days.

(21) Appl. No.: 14/768,671

(22) PCT Filed: Feb. 19, 2014

(86) PCT No.: PCT/AU2014/000145
§ 371 (c)(1),
(2) Date: Aug. 18, 2015

(87) PCT Pub. No.: WO2014/127413
PCT Pub. Date: Aug. 28, 2014

(65) Prior Publication Data
US 2016/0003922 A1 Jan. 7, 2016

Related U.S. Application Data

(60) Provisional application No. 61/767,169, filed on Feb. 20, 2013.

(30) Foreign Application Priority Data
Feb. 20, 2013 (AU) ................................ 2013900573

(51) Int. Cl.
*G01R 33/02* (2006.01)
*E05B 47/00* (2006.01)
(Continued)

(52) U.S. Cl.
CPC ............ *G01R 33/02* (2013.01); *E05B 17/203* (2013.01); *E05B 17/22* (2013.01); *E05B 39/00* (2013.01);
(Continued)

(58) Field of Classification Search
CPC ..................... G01R 33/02; G01B 7/14; E05B 17/20–17/226; E05B 39/00;
(Continued)

(56) References Cited

U.S. PATENT DOCUMENTS 3,187,129 A 6/1965 McBrian
3,406,267 A 10/1968 Kohls
(Continued)

FOREIGN PATENT DOCUMENTS

AU 2007100682 8/2007
DE 10065100 7/2002
(Continued)

OTHER PUBLICATIONS

International Preliminary Report on Patentability for Application No. PCT/AU2014/000145 dated Feb. 20, 2013 (70 pages).
(Continued)

*Primary Examiner* — Melissa Koval
*Assistant Examiner* — Rahul Maini
(74) *Attorney, Agent, or Firm* — Michael Best & Friedrich LLP

(57) ABSTRACT

A latch assembly comprising: a latch operative to adopt a latched condition and an unlatched condition; a magnet imparting a magnetic field; a sensor adapted to sense the magnetic field; the latch, magnet and sensor being configured such that a change in the condition of the latch effects a variance in the magnetic field sensed by the sensor such
(Continued)

that the sensor is able to distinguish between the latched condition and the unlatched condition.

20 Claims, 12 Drawing Sheets

(51) Int. Cl.
| | |
|---|---|
| *E05B 65/00* | (2006.01) |
| *G01B 7/14* | (2006.01) |
| *E05B 43/00* | (2006.01) |
| *E05B 45/00* | (2006.01) |
| *E05C 19/16* | (2006.01) |
| *E05B 47/02* | (2006.01) |
| *E05B 39/00* | (2006.01) |
| *E05B 17/20* | (2006.01) |
| *E05B 45/06* | (2006.01) |
| *E05B 63/20* | (2006.01) |
| *E05B 17/22* | (2006.01) |
| *E05B 45/08* | (2006.01) |

(52) U.S. Cl.
CPC ............ *E05B 43/005* (2013.01); *E05B 45/00* (2013.01); *E05B 45/06* (2013.01); *E05B 45/083* (2013.01); *E05B 47/00* (2013.01); *E05B 47/004* (2013.01); *E05B 47/02* (2013.01); *E05B 63/20* (2013.01); *E05B 65/0007* (2013.01); *E05B 65/0014* (2013.01); *E05C 19/163* (2013.01); *E05C 19/168* (2013.01); *G01B 7/14* (2013.01); *E05B 43/00* (2013.01); *E05B 2045/0665* (2013.01); *E05B 2047/0048* (2013.01); *E05B 2047/0067* (2013.01); *E05B 2047/0069* (2013.01); *E05B 2047/0072* (2013.01)

(58) Field of Classification Search
CPC .............................. E05B 45/00–45/086; E05B 2045/0615–2045/0695; E05B 2047/0048–2047/0081; E05C 19/16–19/168
USPC ......................................... 324/207.11–207.26
See application file for complete search history.

(56) References Cited

U.S. PATENT DOCUMENTS

| | | | |
|---|---|---|---|
| 3,625,312 A | 12/1971 | Hunter | |
| 4,210,888 A | 7/1980 | Holce | |
| 4,213,110 A | 7/1980 | Holce | |
| 5,362,116 A | 11/1994 | Doyle et al. | |
| 5,438,869 A * | 8/1995 | Mueller | H01H 36/0033 29/622 |
| 6,359,538 B1 | 3/2002 | Jolley et al. | |
| 6,441,735 B1 | 8/2002 | Marko et al. | |
| 2004/0100254 A1 | 5/2004 | Viitanen | |
| 2006/0192396 A1 | 8/2006 | Frolov et al. | |
| 2007/0024442 A1* | 2/2007 | Jolley | E05B 17/10 340/542 |
| 2009/0090148 A1 | 4/2009 | Kollin et al. | |
| 2011/0148126 A1* | 6/2011 | Macernis | E05B 65/0007 292/251.5 |

FOREIGN PATENT DOCUMENTS

| | | |
|---|---|---|
| GB | 2310447 | 8/1997 |
| WO | 2011/088496 | 7/2011 |

OTHER PUBLICATIONS

International Search Report for Application No. PCT/AU2014/000145 dated Jun. 3, 2014 (5 pages).
Australian Patent Examination Report No. 1 for Application No. 2013202619 dated Aug. 31, 2015 (7 pages).
Extended European Search Report for Application No. 14754633.7 dated Oct. 20, 2016 (4 pages).

* cited by examiner

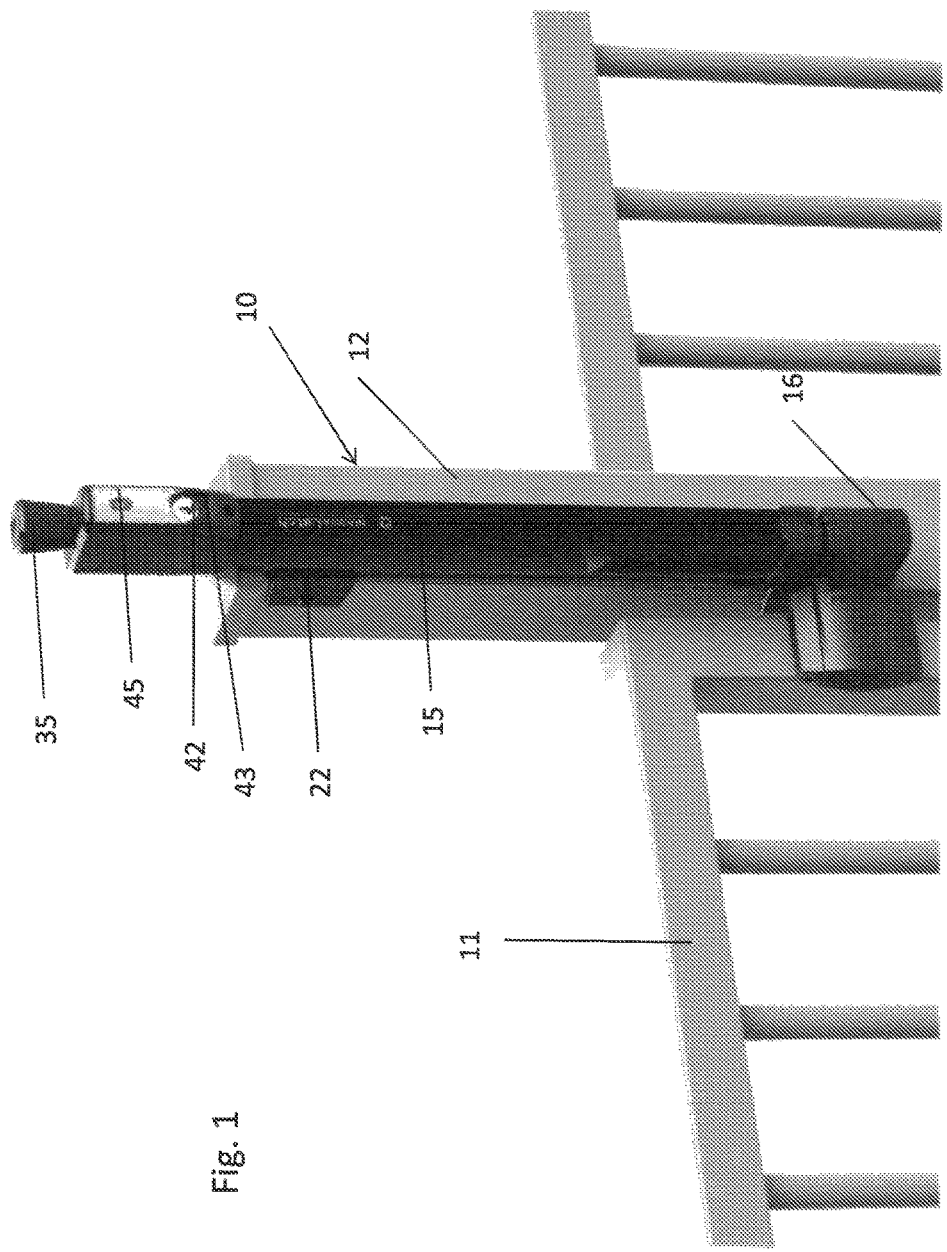

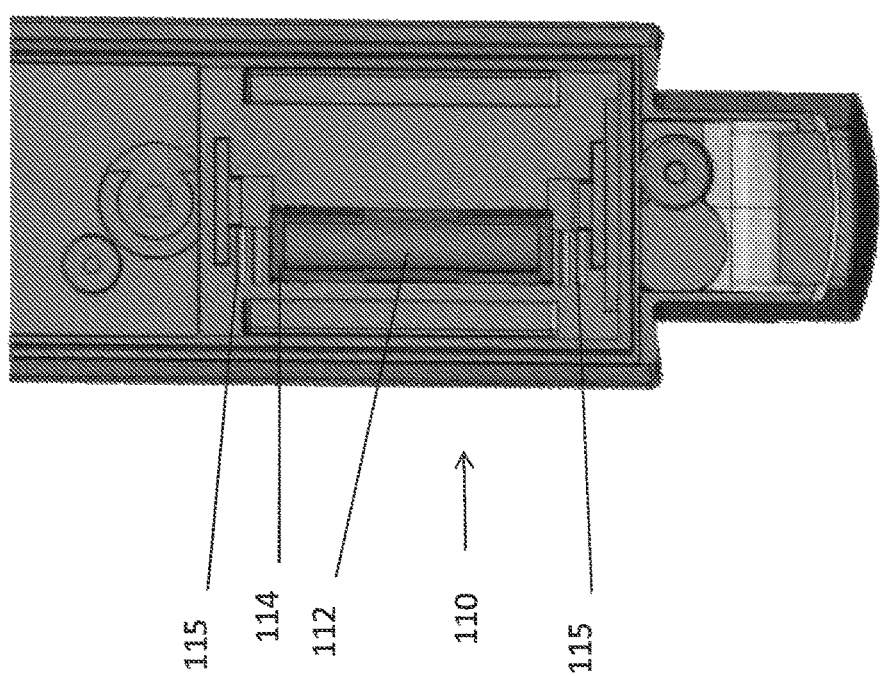

SENSOR CONFIGURATION FOR A LATCH ASSEMBLY

TECHNICAL FIELD

The present disclosure relates to latch assemblies associated with movable barriers. The present disclosure also relates to sensing systems in particular for sensing the latched or unlatched condition of the latching assembly. The present disclosure also relates to the safety of latch assemblies especially relating to gates, particularly for safety enclosures such as in pool fencing.

BACKGROUND TO THE DISCLOSURE

To prevent young children from entering an area such as a swimming pool without supervision, safety enclosures are provided. In some cases, such as for pool fences, they may be required by law. These safety enclosures generally include a self-latching device which is arranged to operate automatically on closing of the gate of the fence and prevents the gate from being reopened without manual release of the mechanism.

One form of such a self-latching device is a magnetic latching device, an example of which is described in WO92/03631.

SUMMARY OF THE DISCLOSURE

The present disclosure relates to improvements in various aspects of latch assemblies for movable barriers including the gates of safety enclosures such as pool fences.

According to one embodiment, the present disclosure provides a latch assembly comprising: a latch operative to adopt a latched condition and an unlatched condition;
- a magnet imparting a magnetic field; a sensor adapted to sense the magnetic field; the latch, magnet and sensor being configured such that a change in the condition of the latch effects a variance in the magnetic field sensed by the sensor such that the sensor is able to distinguish between the latched condition and the unlatched condition.

In some embodiments, the assembly further comprises a ferrite element adapted such that movement of the ferrite element effects a change in the impact of the magnetic field on the sensor.

In some embodiments, the latch assembly is adapted such that movement of the latch into the latched condition is induced by the magnetic field imparted by the magnet.

According to another embodiment, the present disclosure provides a latch assembly comprising a latch operative to adopt a latched condition and an unlatched condition; a magnet imparting a magnetic field; a sensor adapted to sense the magnetic field; the latch, magnet and sensor being configured such that a change in the condition of the latch effects a variance in the magnetic field sensed by the sensor such that the sensor is able to distinguish between the latched condition and the unlatched condition; and an indicator adapted to warn a user that the latch is in its unlatched condition for a predetermined period of time.

According to another embodiment, the present disclosure provides a sensor system for a latching assembly comprising a magnet and a latch, the latch being moveable to adopt a latched condition and an unlatched condition, the sensor system comprising a sensor adapted to distinguish between the latched condition and the unlatched condition by sensing a variation in the magnetic field imparted by the magnet.

According to another embodiment, the present disclosure provides a method of assembling a latch assembly comprising: assembling a latch operative to adopt a latched condition and an unlatched condition, a magnet imparting a magnetic field and a sensor adapted to sense the magnetic field such that a change in the condition of the latch effects a variance in the magnetic field sensed by the sensor such that the sensor is able to distinguish between the latched condition and the unlatched condition; adjusting the position of a ferrite element to effect a change in the impact of the magnetic field on the sensor.

According to another embodiment, the present disclosure provides an alarm system adapted to provide an alarm when a latch of a latch assembly has been in an unlatched condition after a predetermined period of time, the system comprising:
- a sensor adapted to sense a magnetic field imparted by a magnet in the latch assembly to distinguish whether the latch is in a latched or unlatched condition;
- an alarm unit adapted to create at least one alarm; and
- an electronic circuit configured to receive data from the sensor regarding the condition of the latch and transmit a signal to the alarm unit to create an alarm after the predetermined period of time if the sensor continues to sense that the latch is in the unlatched condition.

According to another embodiment, the present disclosure provides a method of raising an alarm to indicate that a latch of a latch assembly has been in an unlatched condition after a predetermined period of time, the method comprising:
- sensing when the latch is in the unlatched condition;
- waiting for a predetermined period of time; and
- if during the predetermined period of time the latch remains in the unlatched condition, creating an alarm.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF FIGURES

Embodiments of the disclosure will now be described by way of example only, with reference to the accompanying drawings in which:

FIG. 1 is a perspective view of a latch mounted on a fence.

FIG. 12 is a detail cross sectional view of a ferrite element of the sensor system according to an embodiment of the disclosure;

DETAILED DESCRIPTION OF EMBODIMENTS

Figure 3:
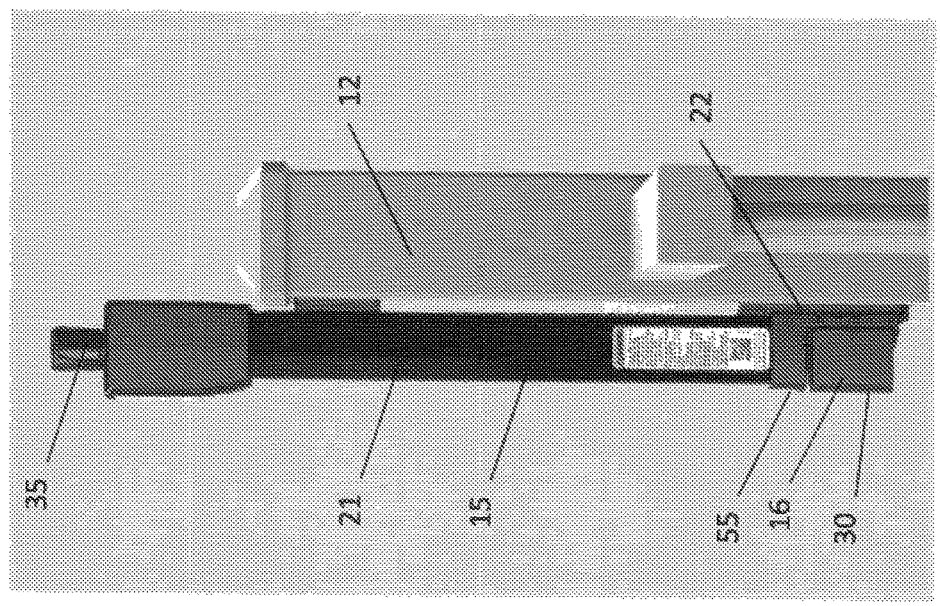
FIG. 3 is a rear view of the latch of FIG. 1.
Figure 2:
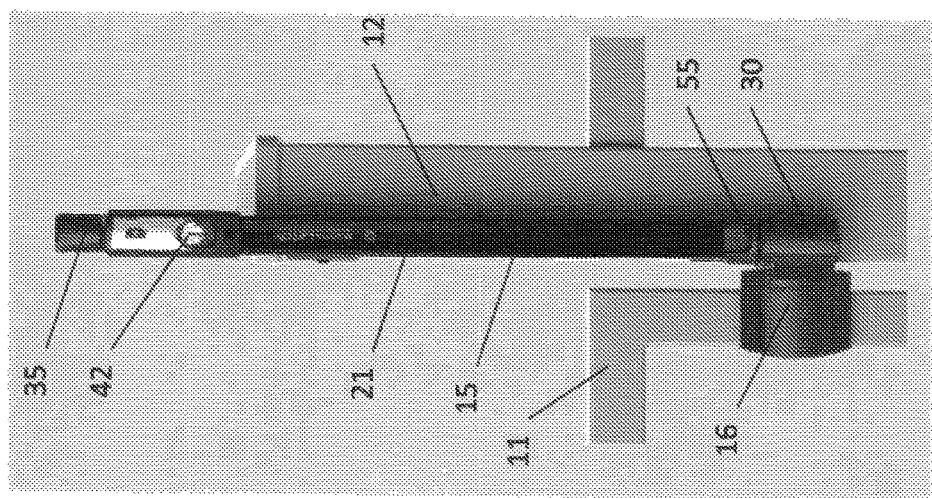
FIG. 2 is a front view of the latch of FIG. 1.

In the following detailed description, reference is made to the accompanying drawings, which form a part thereof. In the drawings, similar symbols typically identify similar components, unless context dictates otherwise. The illustrative embodiments described in the detailed description, drawings, alternative statements of invention, and claims are not meant to be limiting. Other embodiments may be utilised, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

The present disclosure relates generally to latch assemblies for movable barriers. In the illustrated embodiment, the latch assembly is used in latching a pool fencing gate. However, it is to be appreciated that in other embodiments, the latch assembly could be used in respect of other movable barriers and in particular in respect of other safety enclosure gates for example as provided in playground fencing.

A previous gate latch of the Applicant is disclosed in PCT International Publication WO 92/03631 (WO '631). The latch of WO '631 is particularly suitable for pool fencing and utilises magnet force to affect operation of the latch. The in WO '631 comprises a first component including a latching pin mounted within a latch housing and movable between a retracted and a latching or extended position. The latch pin is biased into the retracted position. Normally the latch is attached to a gate post and is orientated so that the latch pin moves within the latch housing in a vertical direction. The latch operates in conjunction with a second component that forms a striker that forms part of the latch and which is typically mounted on the gate. The striker includes a recess which is arranged to receive the latch pin. A permanent magnet is also provided in the striker to draw the latching pin into the recess of the striker when the striker is moved into register with the latch (when the gate is moved to the closed position) so as to effect latching of the latch to hold the gate closed.

It is to be appreciated that whilst embodiments of the present disclosure described herein involve modifications, additions and improvements in relation to the above described magnetic latch, the embodiments could be applied to other magnetic and non-magnetic latch assemblies.

Disclosed in some embodiments is a latch assembly comprising a latch operative to adopt a latched condition and an unlatched condition; a magnet imparting a magnetic field; a sensor adapted to sense the magnetic field; the latch, magnet and sensor being configured such that a change in the condition of the latch effects a variance in the magnetic field sensed by the sensor such that the sensor is able to distinguish between the latched condition and the unlatched condition.

In some embodiments, the magnet is adapted such that movement of the latch into the latched condition is induced by the magnetic field imparted by the magnet.

In some embodiments, the latch comprises a first component which is arranged to be mounted to a movable barrier or surrounding structure and a second component arranged to be mounted on the other of the movable barrier or the surrounding structure, the first component and the second component configured to co-operate to hold the movable barrier in a closed position in the latching condition.

In some embodiments, the first component includes a latch member and the second component includes the magnet, and wherein when in the latched condition, the latch member is closer to the magnet than in the unlatched condition and wherein the proximity of the latch member to the magnet changes the strength of the magnetic field sensed by the sensor.

In some embodiments, the latch member is biased into a retracted position and movable from the retracted position to an engaging position, and wherein when the components are in juxtaposition for latching in the closed position, the latch is arranged to adopt the latching condition by the latch member being caused to be moved against the bias from the retracted position to the engaging position by magnetic attraction between the latch member and the magnet, wherein the latch member establishes engagement with the second component.

In some embodiments, the sensor is located on the first component and the magnet is located on the second component.

In some embodiments, the assembly further comprises a ferrite element adapted such that movement of the ferrite element effects a change in the impact of the magnetic field on the sensor.

In some embodiments, the ferrite element is moveably mounted with respect to the sensor such that movement of the ferrite element effects a change in the sensitivity of the sensor.

In some embodiments, the ferrite element is moveably mounted in relation to the sensor, the ferrite element being moveable between a position in which more of the ferrite element is proximal the sensor and a position in which less of the ferrite element is proximal the sensor.

In some embodiments, the ferrite element is slideably mounted in relation to the sensor.

In some embodiments, the ferrite element is movably mounted on the first component.

In some embodiments, the sensor comprises a reed switch.

In some embodiments, the latch, magnet and sensor are configured such that the magnetic field imparted by the magnet is sensed by the sensor when the latch is in the latched condition.

In some embodiments, the assembly comprising an indicator adapted to warn a user that the latch is in its unlatched condition for a predetermined period of time.

In some embodiments, the indicator comprises an audible and/or visual alarm.

In some embodiments, the indicator can be disengaged or silenced for a predetermined period of time.

Disclosed in further embodiments is a latch assembly comprising a latch operative to adopt a latched condition and an unlatched condition; a magnet imparting a magnetic field; a sensor adapted to sense the magnetic field; the latch, magnet and sensor being configured such that a change in the condition of the latch effects a variance in the magnetic field sensed by the sensor such that the sensor is able to distinguish between the latched condition and the unlatched condition; and an indicator adapted to warn a user that the latch is in its unlatched condition for a predetermined period of time.

In some embodiments, the indicator comprises an audible and/or visual alarm.

In some embodiments, the indicator can be disengaged or silenced for a predetermined period of time.

In some embodiments disclosed is a gate latch assembly comprising a latch assembly as disclosed in any one of the above embodiments.

Disclosed in some embodiments is a sensor system for a latching assembly comprising a magnet and a latch, the latch being moveable to adopt a latched condition and an unlatched condition, the sensor system comprising a sensor adapted to distinguish between the latched condition and the unlatched condition by sensing a variation in the magnetic field imparted by the magnet.

In some embodiments, the sensor system further comprises a ferrite element, the ferrite element being moveable with respect to the sensor to vary the sensitivity of the sensor.

In some embodiments, the system is able to be attached to a housing of the latch.

In some embodiments, the variation in the magnetic field at the sensor is due to one or both of the proximity of the magnet to the sensor and/or the proximity of a component of the latch to the magnet.

Disclosed in some embodiments is a method of assembling a latch assembly comprising assembling a latch operative to adopt a latched condition and an unlatched condition, a magnet imparting a magnetic field and a sensor adapted to sense the magnetic field such that a change in the condition of the latch effects a variance in the magnetic field sensed by the sensor such that the sensor is capable of distinguishing between the latched condition and the unlatched condition; adjusting the position of a ferrite element to effect a change in the impact of the magnetic field on the sensor.

Disclosed in some embodiments is an alarm system adapted to provide an alarm when a latch of a latch assembly has been in an unlatched condition after a predetermined period of time, the system comprising:

a sensor adapted to sense a magnetic field imparted by a magnet in the latch assembly to distinguish whether the latch is in a latched or unlatched condition;

an alarm unit adapted to create at least one alarm; and an electronic circuit configured to receive data from the sensor regarding the condition of the latch and transmit a signal to the alarm unit to create an alarm after the predetermined period of time if the sensor continues to sense that the latch is in the unlatched condition.

In some embodiments, the system comprises a battery arranged to power the alarm unit.

In some embodiments, the electronic circuit is configured to receive data from the battery regarding the battery power and transmit a signal to the alarm unit to create an alarm when the power of the battery is low.

In some embodiments, the electronic circuit is configured to signal to the alarm unit to create a different form of alarm when the power of the battery is low than the alarm for when the latch has been in the unlatched condition after the predetermined period of time.

In some embodiments, the system comprises a silence system which is operable to increase the predetermined period of time.

In some embodiments, the silence system comprises an actuator in communication with the electronic circuit.

In some embodiments, the alarm unit comprises at least one speaker adapted to create an audio element of the alarm.

In some embodiments, the alarm unit comprises at least one LED light adapted to create a visual element of the alarm.

In some embodiments, the alarm system is configured to be activated when the sensor senses no magnetic field from the magnet.

In some embodiments, the alarm system is adapted to calculate the pre-determined period of time as commencing when the sensor has sensed no magnetic field from the magnet.

Disclosed in some embodiments is a method of raising an alarm to indicate that a latch of a latch assembly has been in an unlatched condition after a predetermined period of time, the method comprising:

sensing when the latch is in the unlatched condition;
waiting for a predetermined period of time; and
if during the predetermined period of time the latch remains in the unlatched condition, creating an alarm.

In some embodiments, the method comprises continuing the alarm for an alarm time interval if the latch remains in the unlatched condition.

In some embodiments, the method comprises creating the alarm for periodic alarm time intervals if the latch remains in the unlatched condition.

In some embodiments, the alarm ceases between the periodic alarm time intervals.

In some embodiments, each successive alarm time interval is of increased duration than the previous alarm time interval.

In some embodiments, each successive alarm time interval is of increased intensity than the previous alarm time interval.

In some embodiments, the method comprises increasing the intensity of the alarm over time if the latch remains in the unlatched condition.

In some embodiments, sensing when the latch is in an unlatched condition comprises providing a sensor adapted to sense a magnetic field imparted by a magnet in the latch assembly to distinguish whether the latch is in a latched or unlatched condition.

In some embodiments, the method comprises commencing the pre-determined period of time when the sensor senses no magnetic field from the magnet.

In some embodiments, the alarm comprises an audio element, a visual element or a combination of both.

In some embodiments, the method comprises selectively increasing the pre-determined period of time after the pre-determined period of time has commenced.

Referring to the Figures, an illustrative embodiment of a latch 10 for movable barriers is shown and will now be described with reference to FIGS. 1-4 and 18.

The latch 10 is shown installed for use on a movable barrier in the form of a pool fencing gate 11. The latch 10 is a magnetic type assembly, the operation of which is similar to that described above with respect to WO '631.

The illustrated latch 10 comprises a first component 15 mounted to a fixed post 12 of the pool fencing and a second component 16 mounted to the gate 11. The first and second components 15, 16 releasably engage with one another to hold the gate 11 in a closed position as shown in FIG. 1 for example. The first component 15 provides the main latch structure of the latch 10 (including the latch mechanism and keeper) and the second component 16 provides the striker of the latch.

Although the Figures show an embodiment where the first latch component 15 is mounted to the fixed post 12 and the second component 16 is mounted to the gate 11, it is to be understood that the components 15, 16 could be mounted the other way around.

The first component 15 comprises a latch mechanism 17 incorporating a number of latch members coupled together to form a latch extending along a longitudinal axis, and a housing 21 containing at least a portion of the latch mechanism. One of the latch members is an elongate latching pin 20 housed within the housing 21. The housing body 21 is mounted via mounting brackets 22 to the fixed post 12 and incorporates a keeper 18 disposed at a lower end of the housing body 21 and which is arranged to receive the second (striker) component 16. A spring 23 which forms part of the latch mechanism provides an upward bias on the latching pin 20 so as to hold the pin in an upward position above the keeper when the latching pin is released from the second component and the gate 11 is opened, as will be described in further detail below.

The second component 16 comprises a body 25 having a retaining element in the form of a recess 30 within which is located a permanent magnet 31. The body 25 is mounted to the gate 11 via a mounting portion 32 that couples to a mounting bracket 33. The second component 16, when the gate 11 is closed as shown in FIG. 1, is received within the keeper 18 of the first component. In this configuration, the permanent magnet 31 acts on the latching pin 20 disposed within the housing 21 above the keeper 18, overcoming the bias of the spring 23 to draw the pin into the keeper 18 and into recess 30 of the striker 16 to capture the pin in the striker recess and thereby bring the latching pin into a latched condition.

To bring the latching pin 20 out of its latched condition (ie. into an unlatched condition) and enable the gate 11 to be opened, the latching mechanism 17 further comprises an actuator comprising a gripping portion for a user to grip in the form of a knob 35. The knob 35 is provided on the end of an arm 34, the opposed end of which is connected to the latching pin 20 via a link bar 38 of the latching mechanism 17. The arm 34 and the link bar 38 are further latch members of the latching mechanism and are configured, with the latching pin 20, to extend along the longitudinal axis. The knob 35 is located at and projects beyond the top of the housing 21. To open the gate 11, a user pulls the knob 35 upwards which raises the latching pin 20 out of the recess 30 in the body 25 and away from the magnet 31 which allows the gate to be opened. This usually requires a greater force (against that of the magnet) than can be applied by a small child, which in combination with the high location of the knob 35, enables the magnetic latch to inhibit young children from entering a pool area without supervision.

With the gate 11 open, the biasing spring 23 holds the latching pin 20 in its now elevated position, even when the user lets go of the knob 35. Furthermore, the latch mechanism includes a lost motion arrangement incorporating a lost motion cage 36 which allows for the knob 35 to return to its rest position when the latching pin 20 is in its elevated position and also ensures that the weight of the upper portion 37 of the latch mechanism (which includes the knob 35 and link bar 38) does not bias the latch pin into lowered position which could otherwise prevent the latch from adopting its latched condition when the gate is closed. Further details of the lost motion arrangement are disclosed in WO '631, the contents of which are incorporated by cross reference.

When the gate 11 is swung back to its closed position, the striker body 25 containing the permanent magnet 31 is brought back into alignment with the latching pin 20 and automatically draws the pin down back into the recess 30 under the influence of the magnetic force provided by the magnet. As described above, the magnetic force is sufficiently great enough to overcome the bias provided by the spring 23 that holds the latching pin up when the gate is open. As a result the latching of the gate happens automatically upon closing.

The latch 10 also comprises a key operated lock mechanism 40 for locking the latching pin 20 in its latched condition where it is retained in the recess 30 of the second striker component 16. The lock mechanism is also housed within the housing 21 of the first component. The lock mechanism 40 comprises a key barrel 41 having a key receiving opening in an outer face of the housing 21. Rotation of the key barrel 41 using the key brings the lock mechanism 40 into a locking condition where it engages with one of the latch members of the locking mechanism 17. More specifically, a first lock member 44 is rotated by rotation of the key barrel 41, which causes a second lock member 45 to move from a retracted configuration to a projected configuration where it engages the arm 34 extending from the knob 35. In this locking condition, the lock mechanism 40 prevents upward axial movement of the latch members including the latching pin 20 under manual operation of the knob 35 and thus locks the latching pin in its latched condition. In these conditions, the gate 11 cannot be unlatched and opened without the key to operate the lock mechanism 40, providing an additional level of safety in particular for pool fencing gates.

Referring now to FIGS. 4-9, a latching assembly 50 comprises the latch 10 and a latch sensor system 100 which in the illustrated form is mounted onto an external housing of the first latch component 15 of the latch 10. In this way the sensor system can be provided by a separate module to the latch 10 and does not directly engage the latch mechanism used in the latch 10.

The latch sensor system 100 comprises a magnetic field sensor 102. In the illustrated form the magnetic field sensor 102 is in the form of a reed switch. The reed switch is arranged to switch between an open position (where the contact is open) and a closed position (where the contact is closed) depending on the presence or absence of a magnetic field of particular strength. The magnetic field sensor 102 is positioned and adapted to sense the magnetic field imparted by the permanent magnet 31 in a latched configuration.

Figure 5:
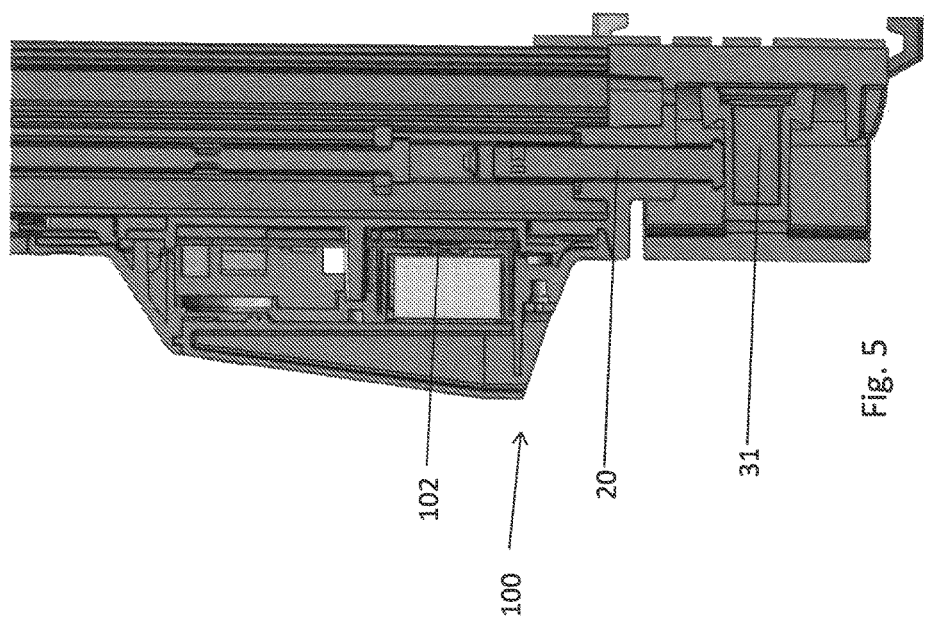
FIG. 5 is a cross sectional detail of the latch assembly of FIG. 4.
Figure 4:
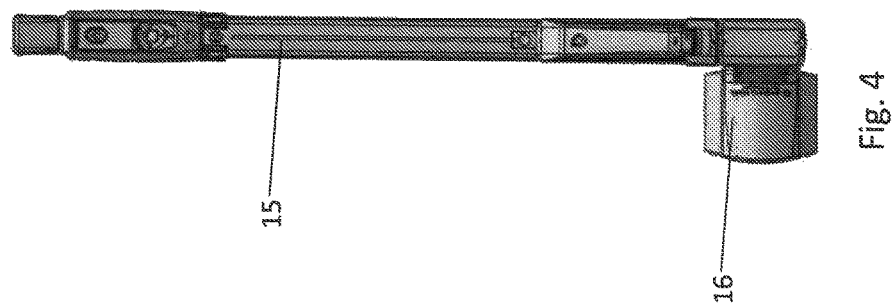
FIG. 4 is a front view of a latch assembly including the latch of FIG. 1 in a closed and latched condition and a sensor system.

In use when the latching pin 20 of the latching assembly 10 is in the latched condition, as illustrated in FIG. 5, the latching pin 20 is positioned proximal the permanent magnet 31. In this condition the magnetic field from the permanent magnet 31 passes through the latching pin 20 and is detected by the magnetic field sensor 102. The strength of the magnetic field detected is arranged to place the reed switch in one of the open or closed position and in that position, no alarm sequence is generated and the system becomes inactive.

Figure 7:
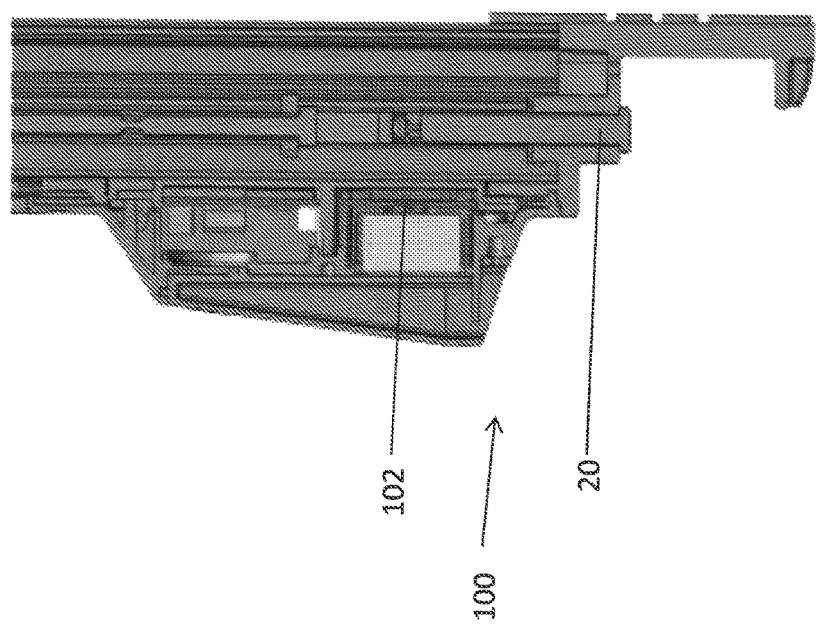
FIG. 7 is a cross sectional detail of the latch assembly of FIG. 6.
Figure 6:
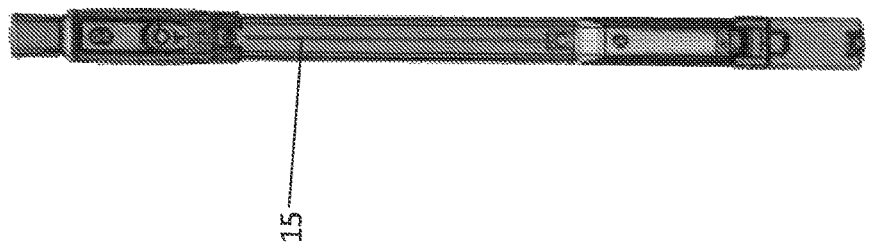
FIG. 6 is a front view of the latch assembly of FIG. 4 in an open condition.

FIGS. 6-9 show the latching pin 20 of the latching assembly 10 in unlatched conditions. As shown in FIGS. 6 and 7, the latching pin 20 is in the unlatched condition when the pool fencing gate (not illustrated in these Figs) is open and thus the latching pin 20 which is associated with the first latching component 15 is remote from the permanent magnet 31 associated with the second latching component 16. The magnetic field associated with the permanent magnet 31 is thus not sensed by the magnetic field sensor 102. This causes the reed switch to be in the other of the open or closed position and this determination begins an alarm sequence.

Figure 9:
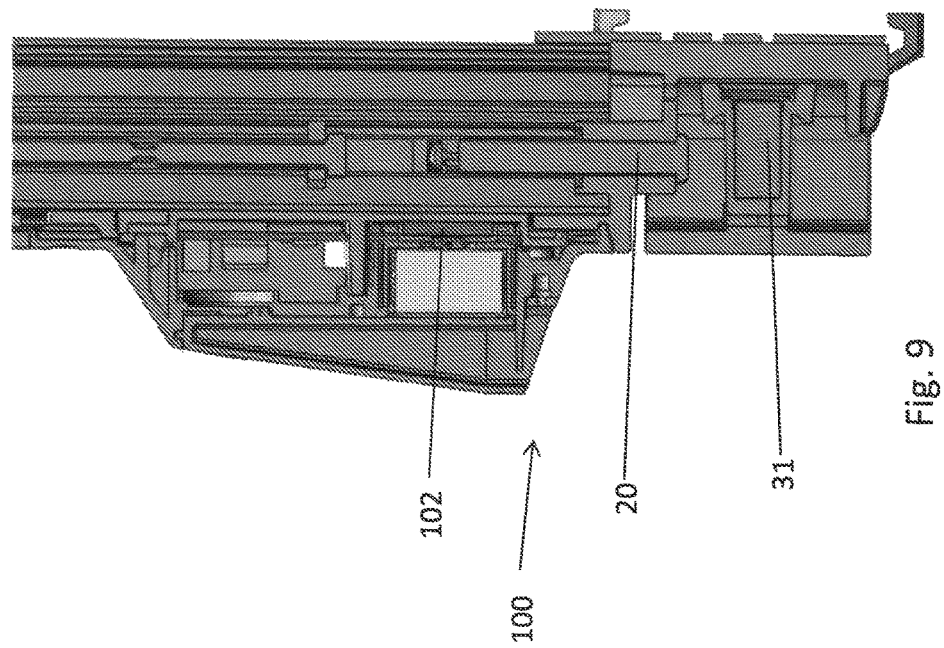
FIG. 9 is a cross sectional detail of the latch assembly of FIG. 8.
Figure 8:
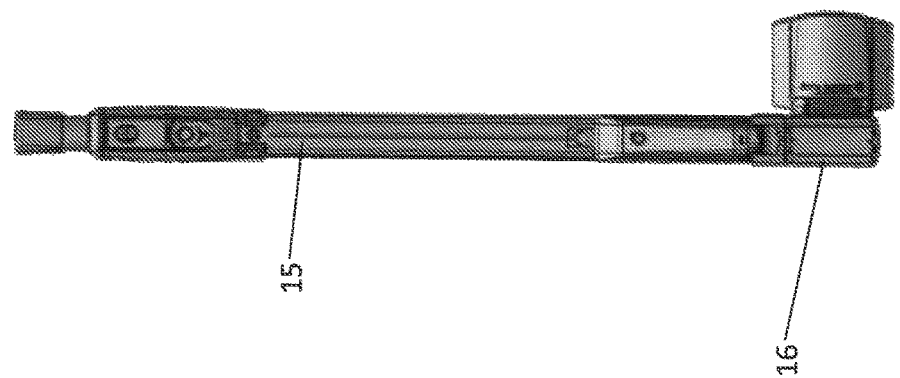
FIG. 8 is a front view of the latch assembly of FIG. 4 in a closed but unlatched condition.

In FIGS. 8 and 9, the latching pin 20 is in an unlatched condition because the latching pin 20 is not drawn into the keeper 18 of the latching assembly 10 even though the components are juxtaposed for latching with the gate closed. As a result in this condition the fencing gate appears closed but is not operatively latched. In this unlatched condition the distance between the permanent magnet 31 and the latching pin 20 is sufficiently large that only minimal magnetic field passes through the latching pin 20. As a result the magnetic field sensor 102 senses only a minimal magnetic field. In this condition the sensor is adapted to interpret the minimal magnetic field as indicating the latching assembly 10 is not in the latched condition. Again the minimal magnetic field causes the reed switch to be in the other of the open or closed position which begins the alarm sequence.

Figure 11:
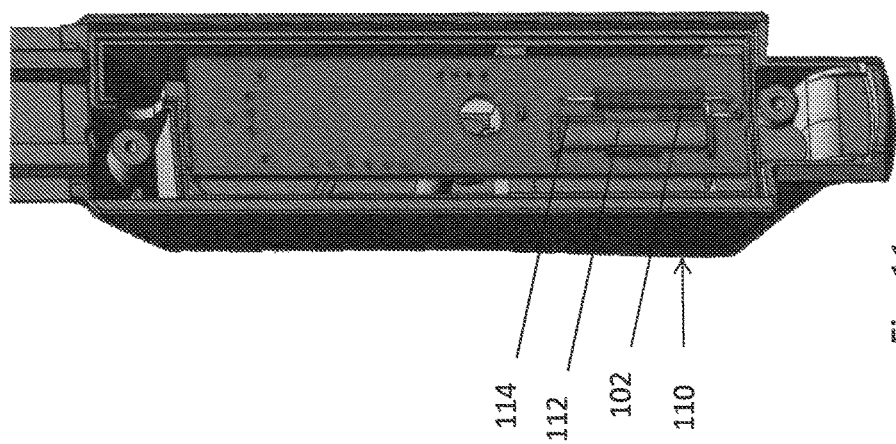
FIG. 11 is a rear uncovered view of the sensitivity adjustment arrangement of FIG. 10.
Figure 10:
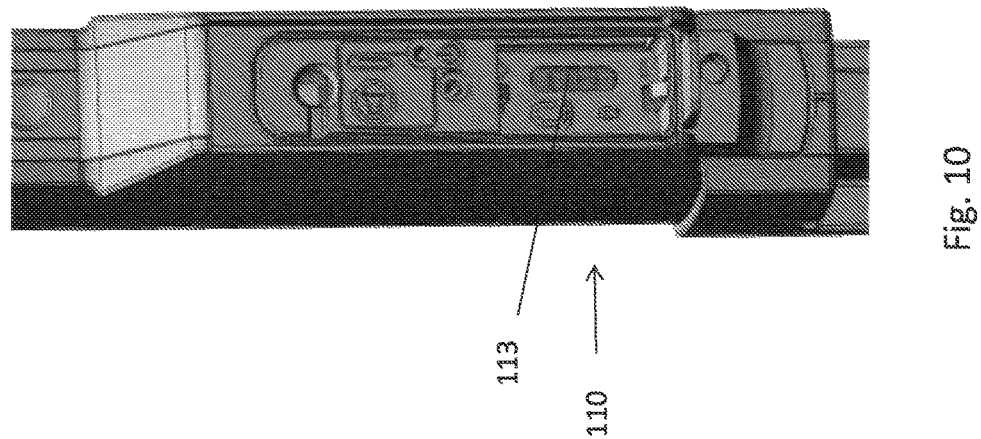
FIG. 10 is a front uncovered view of a sensitivity adjustment arrangement of the sensor system according to an embodiment of the disclosure.
Figure 14:
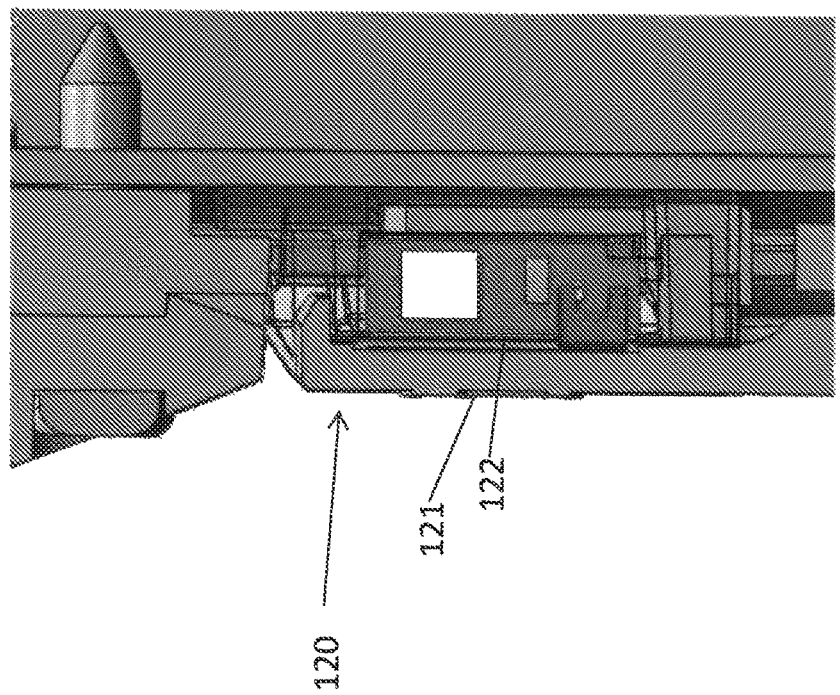
FIG. 14 is a side cross sectional detail of the silence system of FIG. 13.
Figure 13:
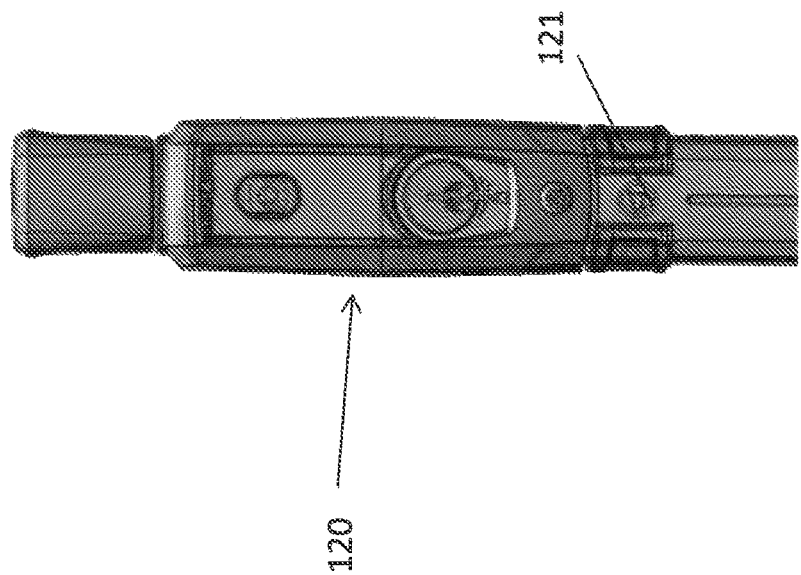
FIG. 13 is a front view of a silence system of one embodiment of the disclosure.
Figure 16:
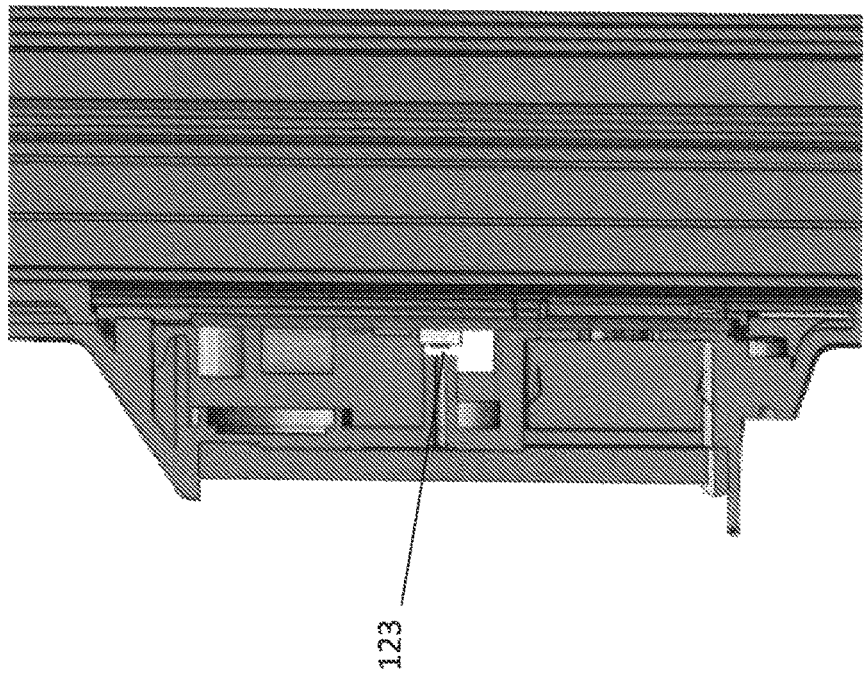
FIG. 16 is a side cross sectional view of the silence system activator of FIG. 15.
Figure 15:
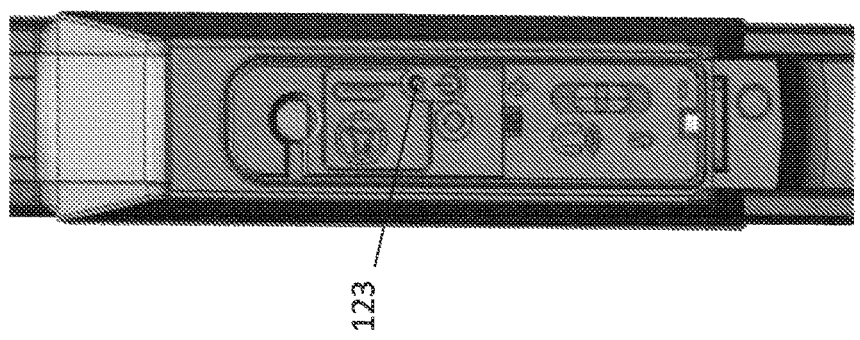
FIG. 15 is a front view of a silence system activator of one embodiment of the disclosure.

Referring to FIGS. 10-12, the sensor system further comprises a sensitivity adjustment arrangement 110 which, in the illustrated form, is designed to allow the strength of the magnetic field sensed by the magnetic field sensor 102 to be adjusted.

In the illustrated form the sensitivity adjustment arrangement 110 comprises a ferrite rod 112 located in the first latching component 15. The ferrite rod 112 is positioned proximal the magnetic field sensor 102 in the form of a reed switch. In order to allow for adjustment in the sensitivity of the magnetic field sensor 102 the ferrite rod 102 is moveable. In the illustrated form the ferrite rod 112 is longitudinally slideable with respect to the magnetic field sensor 102. However any adjustable movement of the ferrite rod 112 with respect to the magnetic field sensor 102 which allows the effect of the ferrite rod 112 on the magnetic field sensor 102 to be increased or decreased can act as a sensitivity adjustment arrangement encompassed by this description.

In the illustrated form, the sensitivity adjustment is designed to occur during manufacture of the latching assembly. As shown in FIG. 11, the sensitivity adjustment arrangement 110 further includes a slideable controller 113 which is engaged with the ferrite rod 112 to allow for movement of the ferrite rod with respect to the magnetic field sensor. In the illustrated form, the ferrite rod 112 is moveable into notched positions 115 to allow the ferrite rod 112 to be secured in position with respect to the magnetic field sensor 102 after adjustment. As shown in FIG. 12, the ferrite element 112 is engaged with a slideable mounting 114 to allow sliding movement of the element The sensitivity adjustment arrangement 110 has the benefit of allowing for a consistent latch sensor system 100 despite variations in sizes, positioning and field strength of the components of the latching assembly.

While the ferrite element 112 of the sensitivity adjustment arrangement 110 has been shown mounted proximal to the sensor in the illustrated form, it could similarly be mounted proximal to the magnet 31 or another element of the sensor system 100 to adjust the intensity of the magnetic field as required.

Referring now to FIGS. 13-16 the latch sensor system 100 further includes a silence system 120. The silence system 120 comprises a silence actuator in the form of a button 121 which, in the illustrated form, is positioned in a face of the first latching component 15. Contact with the silence button 121 is sensed by a silencing sensor 122 which activates a 20 minute silence process. The silence system 120 must be initially activated by a user pressing an activator in the form of an activation button 123 as its automatic setting is set not to function for maximum safety.

Figure 17:
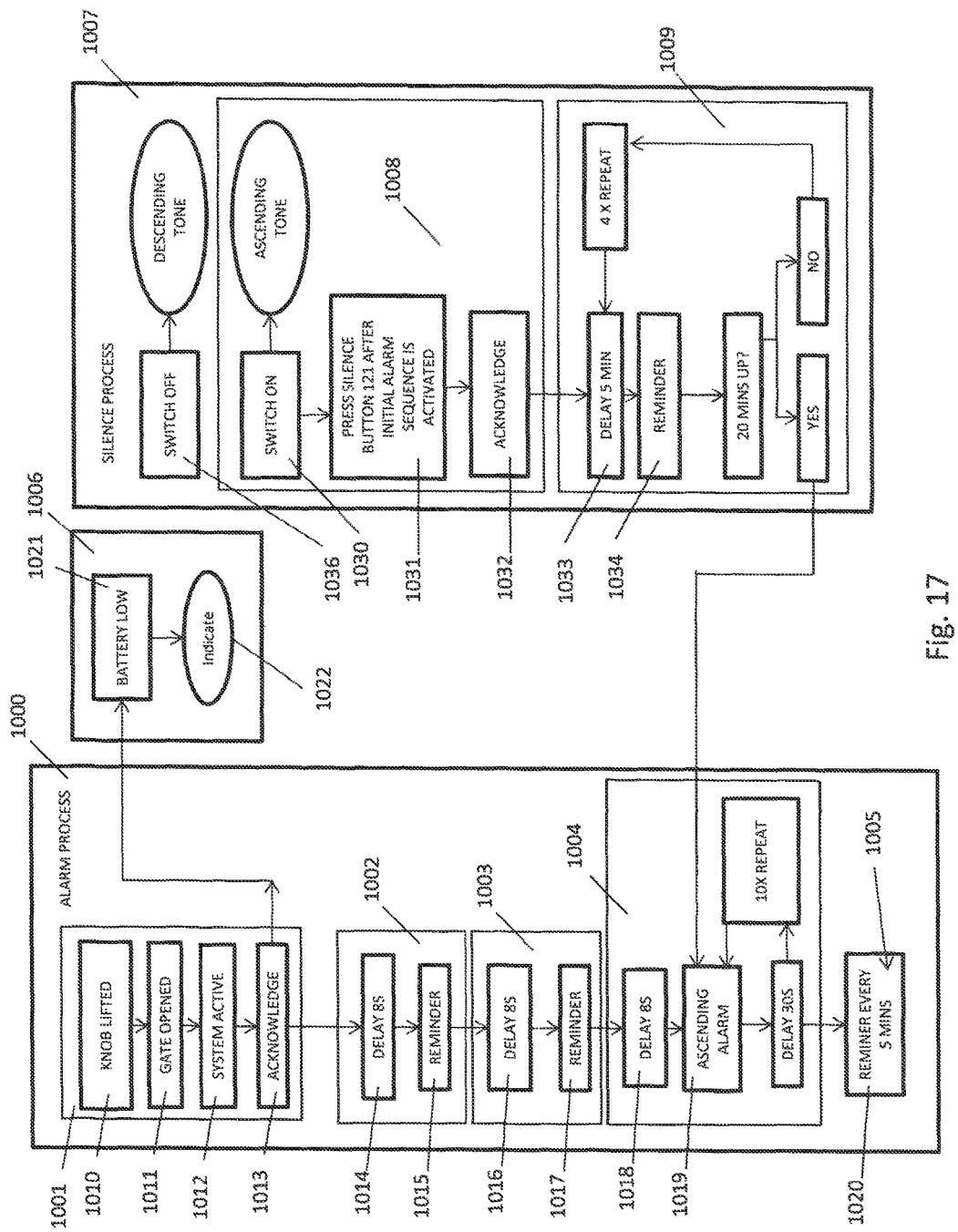
FIG. 17 is a flow chart outlining an alarm process according to an embodiment of the disclosure.
Figure 18:
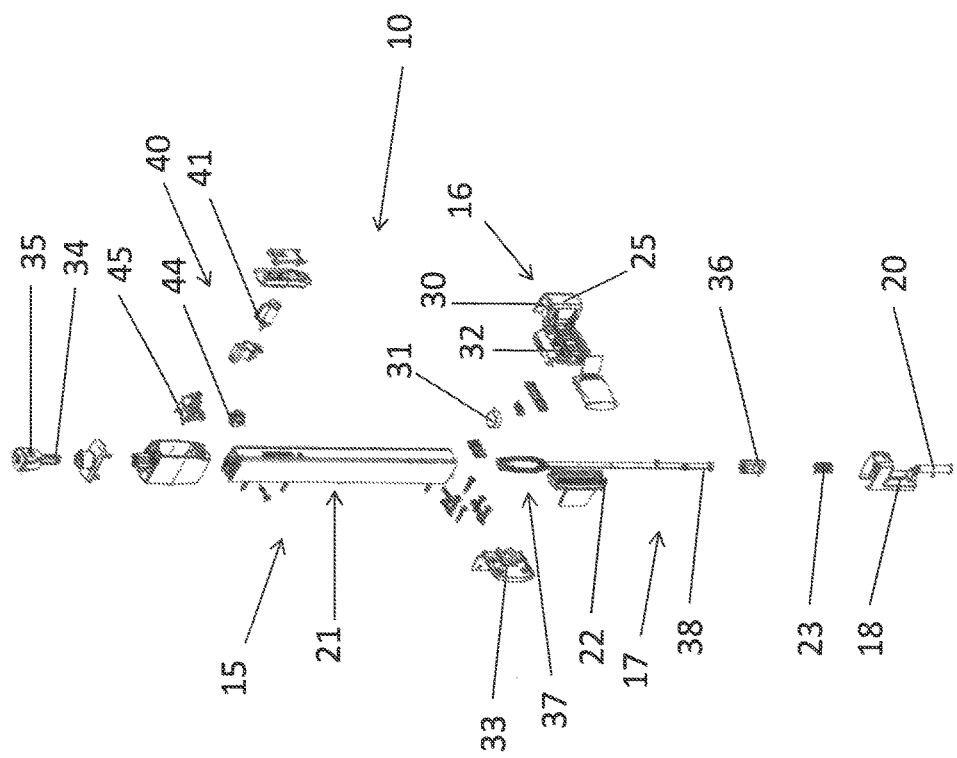
FIG. 18 shows an exploded view of the latch of FIG. 1.
Figure 19:
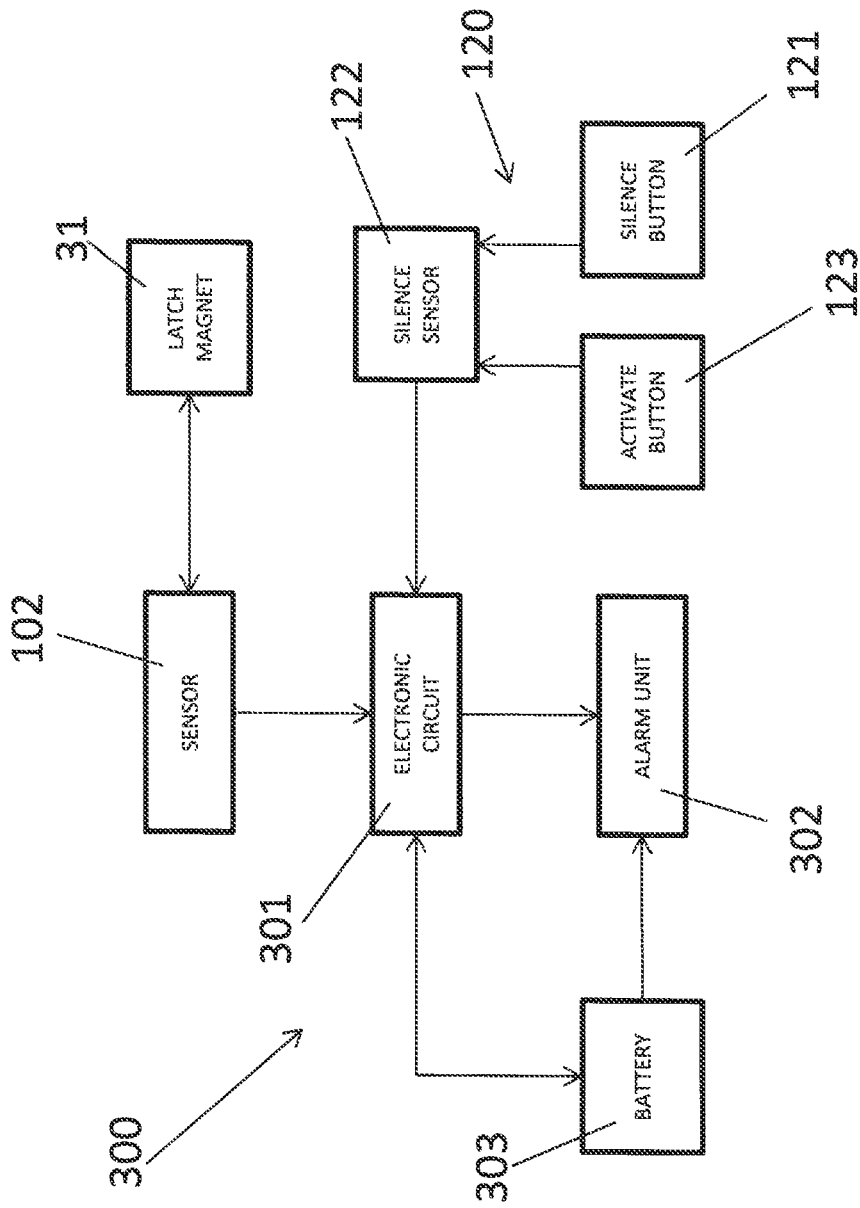
FIG. 19 is a schematic view of an alarm system according to an embodiment of the disclosure.

Referring now to FIGS. 17 and 19, an alarm system 300 is illustrated by way of a schematic in FIG. 19 which is configured to operate an alarm process 1000 as illustrated by way of a flowchart in FIG. 17.

The alarm system 300 incorporates the magnetic field sensor 102 described above which is sensing the magnetic field of the magnet 31 in the latch 10. The alarm system 300 comprises an electronic circuit 301 which is configured to receive data from the sensor 102 regarding the condition of the latch 10. The electronic circuit 301 may incorporate a microprocessor to control the alarm process 1000. The alarm system 300 also comprises an alarm unit 302 for creating an alarm when signalled to do so by the electronic circuit 301. The alarm unit 302 incorporates at least one speaker and at least one LED light which enables the alarm to create audio, visual or audio-visual alarms. The alarm unit 302 is configured to be capable of creating different types of alarms.

The alarm system also comprises a battery 303 for powering the alarm unit 302. The battery 303 also communicates with the electronic circuit 301 to monitor the power level of the battery. The alarm system 300 also incorporates the silence system 120 including the silence button 121, the silence sensor 122 and the activation button 123.

Referring in particular to FIG. 17, the alarm process 1000 will now be described. The alarm process 1000 provides a method of raising an alarm to indicate that the latch 10 has been in an unlatched condition after a predetermined period of time. The alarm process 1000 comprises an activation sequence 1001 for activating the alarm system 300 and initiating the process 1000, followed by a series of alarm sequences 1002, 1003, 1004, and 1005.

When the gate 11 is in its closed position and the latch 10 is in its latched condition with the latching pin 20 received in the striker recess 30 in close proximity to the magnet 31, the alarm system 300 remains deactivated. The activation sequence 1001 of the alarm process 1000 is initiated when the knob 35 is lifted 1010 to cause the latch 10 to adopt its unlatched condition and the gate 11 is opened 1011 from its closed is position. Both of these steps 1010, 1011 in the activation sequence 1001 are detected by the sensor 102 which communicates this to the electronic circuit 301 to activate the alarm system 300 in step 1012 of the activation sequence 1001. Activation of the alarm system 300 is acknowledged 1013 by the electronic circuit 301 signalling to the alarm unit 302 to create a brief audio and/or visual activation alarm. This also provides an alert that the gate 11 has been opened.

Once the alarm system 300 has been activated, the system is configured to operate the alarm process 1000 until the sensor 102 senses that the latch 10 has been returned to its latching condition. As soon as this occurs, the alarm process 1000 immediately ceases and the alarm system 300 is deactivated. Advantageously, the alarm system 300 and process 1000 provides an alarm for when the gate 11 has not been properly latched to secure against unsupervised entry into the secured area (eg. a pool) by children.

After activation of the system 300 in the activation sequence 1001, the alarm process 1000 commences the first alarm sequence 1002. This comprises initiating a first timer 1014. The timer sets a pre-determined period of time (in the embodiment approximately 8 seconds) from the gate 11 being opened in step 1011. The predetermined period of time is set to provide a reasonable time frame to close the gate 11 and return the latch 10 to its latched condition without setting off an alarm. However, if the latch 10 has not been returned to its latched condition within the predetermined period of time 1014, the first alarm sequence 1002 provides a first alarm reminder 1015 for a first alarm time interval.

After the first alarm reminder 1015 has been completed, the alarm process 1000 proceeds to the second alarm sequence 1003. The second alarm sequence comprises waiting 1016 for a second pre-determined period of time (in the embodiment 8 seconds) as set by a second timer from the first alarm reminder 1015. The second alarm sequence 1003 similarly comprises providing a second alarm reminder 1017 for a second alarm time interval after waiting for the second pre-determined period of time 1016 set by the second timer.

The alarm process 1000 subsequently proceeds to the third alarm sequence 1003 which comprises waiting for a pre-determined period of time 1018 after the second alarm reminder 1017 before providing a third alarm reminder 1019. The third alarm sequence 1003, in the illustrated embodiment, involves a number of repetitions of the third alarm reminder 1019 after pre-determined periods of time. The alarm process 1000 subsequently proceeds to a fourth alarm sequence 1005. The process 1000 is arranged so that the fourth alarm sequence 1005 continues indefinitely until the latch 10 has been returned to its latched condition.

Each alarm reminder generally involves a combination of audio and visual alarm signals provided by the alarm unit 302, for example a sound emitted from a speaker and a flashing of a LED light. The alarm process 1000 is configured so that each subsequent alarm reminder in the first to third alarm sequences 1002-1004 have an alarm time interval of increasing duration. Further, each subsequent alarm reminder in the first to third alarm sequences is of increased intensity such as by increasing the pitch, the volume or modifying the style of the alarm where there is an audio alarm element to the alarm reminder. For example the alarm reminder 1019 in the third alarm sequence 1004 comprises an ascending sound for 30 seconds as compared to single pitch sound used for the alarm reminders 1015, 1017 in the first and second alarm sequences. The fourth alarm sequence 1005, which continues indefinitely at the end of the alarm process 1000, has a consistent alarm reminder 1020 every time it is repeated (in the embodiment every five minutes).

Also, in the embodiment described above, the predetermined periods of time that the alarms sequences wait for before providing alarm reminders are of approximately the same duration. However, in other embodiments each subsequent period of time that the alarm sequences wait before providing alarm reminders may be shorter than the previous period of time to provide a sense of urgency.

The alarm process 1000 also comprises a battery power check sequence 1006. The battery power check sequence 1006 commences during the activation sequence 1001 of the alarm process 1000. In the battery power check sequence 1006, the electronic circuit 301 checks the power level of the battery 303, if the battery power is low 1021, then electronic circuit signals the alarm unit 302 to provide an battery low alarm 1022. In the embodiment shown in FIG. 17, this occurs after activation of the alarm system 300 is acknowledged 1013 by the alarm unit 302 to creating a brief activation alarm. The alarm unit 302 is adapted to provide a different type of alarm, aurally and/or visually, to distinguish between the battery low alarm and all other alarms provided by the alarm unit 302. Advantageously, the battery power check sequence 1006 mitigates the risk that the battery 303 powering the alarm unit 302 could inadvertently go flat, leaving the alarm unit 302 inoperative and the alarm system 300 ineffective.

FIG. 17 also shows how the silence process 1007 modifies the alarm process 1000 by extending the predetermined time periods between the alarm reminders that the latch remains in the unlatched condition. The silence process 1007 comprises an activation sequence 1008 followed by an alarm sequence 1009 (of 20 minutes in the illustrated embodiment). At the end of the alarm sequence 1009, should the latch remain in the unlatched condition, the silence process 1007 proceeds to one of the alarm sequences (in the illustrated embodiment it is the highest intensity third alarm sequence 1004) in the alarm process.

As described above the silence process 1007 can only be activated if the silence system 120 has first been switched on 1030 by pressing the activation button 123. The activation button 123 is also used to switch the silence system 120 off 1036. When the silence system is switched on or off 1030, 13036, the electronic circuit 301 signals to the alarm unit 302 to provide an alert that the silence system 120 that this has occurred.

The activation sequence 1008 of the silence process 1007 also requires that the silence button 121 be pressed in step 1031. The alarm system 300 and the silence system 120 are configured so that the silence button is only operable to activate the silence process 1007 when the alarm system 300 has been activated (ie. after the latch has been unlatched and the gate opened). This mitigates the risk that the silence sequence has been inadvertently activated prior to a person opening the gate, of which that person is not aware. Once the silence button has been pressed 1031, the activation of the silence system 120 is acknowledged 1032 by the electronic circuit 301 signalling to the alarm unit 302 to create a brief audio and/or visual activation alarm.

After activation of the silence system 120 in the activation sequence 1008, the alarm sequence 1009 commences. The alarm sequence 1009 continues for a set period of time (in the illustrated embodiment, 20 minutes) unless the latch is returned to its latched condition. The alarm sequence 1009 first initiates a timer to set a predetermined period of time (in the embodiment five minutes) from the gate 11 being opened in step 1011. After waiting 1033 for this pre-determined period of time set by, the alarm sequence 1009, if the latch has not been returned to its latched condition, the alarm sequence 1009 of the silence process 1007 provides an alarm reminder 1034. The five minute waiting period 1033 and subsequent alarm reminder 1034 are repeated four times, after which the silence process 1007 is completed and the alarm system 300 commences the third alarm sequence 1004 in the alarm process 1000.

The five minute delays between the alarm reminders in the silence process 1007 are substantially longer than the delays between the alarm reminders in at least the initial alarm reminders in the alarm process 1000.

It is to be understood that, if any prior art publication is referred to herein, such reference does not constitute an admission that the publication forms a part of the common general knowledge in the art, in Australia or any other country.

In the claims and alternative statements of invention which follow and in the preceding disclosure, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the present disclosure.

Accordingly, the present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods which can, of course, vary. It is also to be understood that the terminology used herein is for the purpose of describing particular embodiments only, and is not intended to be limiting.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the claims.

ALTERNATIVE STATEMENTS OF INVENTION

Alternative statements of invention are recited in the following numbered clauses.
1. A latch assembly comprising:
   a latch operative to adopt a latched condition and an unlatched condition;
   a magnet imparting a magnetic field;
   a sensor adapted to sense the magnetic field;
   the latch, magnet and sensor being configured such that a change in the condition of the latch effects a variance in the magnetic field sensed by the sensor such that the sensor is able to distinguish between the latched condition and the unlatched condition,
   wherein the latch includes a latch member that is moveable relative to both the sensor and the magnet when the latch changes from the unlatched condition to the latched condition and the proximity of the latch member to the magnet changes the strength of the magnetic field sensed by the sensor.
2. A latch assembly according to clause 1, wherein the sensor senses the magnetic field from the latch member.
3. A latch assembly according to any preceding clause, wherein the latch member is made from a non-permanent magnetised material.
4. A latch assembly comprising:
   a latch operative to adopt a latched condition and an unlatched condition;
   a magnet imparting a magnetic field;
   a sensor adapted to sense the magnetic field;
   the latch, magnet and sensor being configured such that a change in the condition of the latch effects a variance in the magnetic field sensed by the sensor such that the sensor is able to distinguish between the latched condition and the unlatched condition,
   wherein the latch includes a latch member that is moveable relative to the magnet when the latch changes from the unlatched condition to the latched condition, the latch member being made from a non-permanent magnetised material and the sensor senses the magnetic field from the latch member.
5. A latch assembly according to any preceding clause, wherein the magnet is adapted such that movement of the latch into the latched condition is induced by the magnetic field imparted by the magnet.
6. A latch assembly according to any preceding clause, wherein the strength of the magnetic field sensed by the sensor causes the sensor to adopt one of an open or a closed position.
7. A latch assembly according to any preceding clause, wherein the latch comprises a first component which is arranged to be mounted to a movable barrier or surrounding structure and a second component arranged to be mounted on the other of the movable barrier or the surrounding structure, the first component and the second component configured to co-operate to hold the movable barrier in a closed position in the latching condition.
8. A latch assembly according to clause 7, wherein the first component includes a latch member and the second component includes the magnet, and wherein when in the latched condition, the latch member is closer to the magnet than in the unlatched condition and wherein the proximity of the latch member to the magnet changes the strength of the magnetic field sensed by the sensor.
9. A latch assembly according to clause 7 or 8, wherein the latch member is biased into a retracted position and movable from the retracted position to an engaging position, and wherein when the components are in juxtaposition for latching in the closed position, the latch is arranged to adopt the latching condition by the latch member being caused to be moved against the bias from the retracted position to the engaging position by magnetic attraction between the latch member and the magnet, wherein the latch member establishes engagement with the second component.
10. A latch assembly according to any one of clauses 7 to 9, wherein the sensor is located on the first component and the magnet is located on the second component.
11. A latch assembly according to any preceding clause, further comprising a ferrite element adapted such that movement of the ferrite element effects a change in the impact of the magnetic field on the sensor.
12. A latch assembly according to clause 11 when dependent on clause 6, wherein movement of the ferrite element adjusts the sensitivity at which the sensor operates between the open and closed positions in response to the strength of the magnetic field.
13. A latch assembly according to clause 11 and 12, wherein the ferrite element is moveably mounted with respect to the sensor such that movement of the ferrite element effects a change in the sensitivity of the sensor.
14. A latch assembly according to clause 11, wherein the ferrite element is positioned adjacent to or juxtaposed with the sensor.
15. A latch assembly according to any one of clauses 11 to 14, wherein the ferrite element is moveably mounted in relation to the sensor, the ferrite element being moveable between a position in which more of the ferrite element is proximal the sensor and a position in which less of the ferrite element is proximal the sensor.
16. A latch assembly according to any one of clauses 11 to 15, wherein the ferrite element is slideably mounted in relation to the sensor.
17. A latch assembly according to any one of clauses 11 to 16 when dependent on clause 7, wherein the ferrite element is movably mounted on the first component.

18. A latch assembly according to any preceding clause, wherein the sensor comprises a reed switch.

19. A latch assembly according to any preceding clause, further comprising an indicator adapted to warn a user that the latch is in its unlatched condition for a predetermined period of time, the indicator being responsive to the sensor.

20. A latch assembly according to clause 19, wherein the indicator comprises an audible and/or visual alarm.

21. A latch assembly according to clause 19 or 20, wherein the indicator can be disengaged or silenced for a predetermined period of time.

22. A latch assembly comprising:
  i. a latch operative to adopt a latched condition and an unlatched condition;
  ii. a magnet imparting a magnetic field;
  iii. a sensor adapted to sense the magnetic field;
  iv. the latch, magnet and sensor being configured such that a change in the condition of the latch effects a variance in the magnetic field sensed by the sensor such that the sensor is able to distinguish between the latched condition and the unlatched condition; and
  v. an indicator adapted to warn a user that the latch is in its unlatched condition, the indicator being responsive to the sensor.

23. A latch assembly according to clause 22, wherein the indicator comprises an audible and/or visual alarm.

24. A latching assembly according to clause 22 or 23, wherein the indicator can be disengaged or silenced for a predetermined period of time.

25. A gate latch assembly comprising a latch assembly according to any one of the preceding clauses.

26. A sensor system for a latching assembly comprising a magnet and a latch, the latch being moveable to adopt a latched condition and an unlatched condition, the sensor system comprising a sensor adapted to distinguish between the latched condition and the unlatched condition by the strength of the magnetic field imparted by the magnet that is sensed by the sensor, wherein the system is able to be attached to a housing of the latch.

27. A sensor system according to clause 26, further comprising a ferrite element, the ferrite element being moveable with respect to the sensor to vary the sensitivity of the sensor.

28. A sensor system according to any one of clauses 25 to 27, wherein the strength in the magnetic field at the sensor is due to one or both of the proximity of the magnet to the sensor and/or the proximity of a component of the latch to the magnet.

29. A method of calibrating a latch assembly comprising:
  providing a latch operative to adopt a latched condition and an unlatched condition, a magnet imparting a magnetic field and a sensor adapted to sense the magnetic field such that a change in the condition of the latch effects a variance in the magnetic field sensed by the sensor such that the sensor is able to distinguish between the latched condition and the unlatched condition;
  adjusting the position of a ferrite element to effect a change in the impact of the magnetic field on the sensor.

30. An alarm system adapted to provide an alarm when a latch of a latch assembly has been in an unlatched condition after a predetermined period of time, the system comprising:
  a sensor adapted to sense a magnetic field imparted by a magnet in the latch assembly to distinguish whether the latch is in a latched or unlatched condition;
  an alarm unit adapted to create at least one alarm; and
  an electronic circuit configured to receive data from the sensor regarding the condition of the latch and transmit a signal to the alarm unit to create an alarm after the predetermined period of time if the sensor continues to sense that the latch is in the unlatched condition.

31. An alarm system according to clause 30, wherein the system comprises a battery arranged to power the alarm unit.

32. An alarm system according to clause 31, wherein the electronic circuit is configured to receive data from the battery regarding the battery power and transmit a signal to the alarm unit to create an alarm when the power of the battery is low.

33. An alarm system according to clause 32, wherein the electronic circuit is configured to signal to the alarm unit to create a different form of alarm when the power of the battery is low than the alarm for when the latch has been in the unlatched condition after the predetermined period of time.

34. An alarm system according to any one of clauses 30 to 33, wherein the system comprises a silence system which is operable to increase the predetermined period of time.

35. An alarm system according to clause 34, wherein the silence system comprises an actuator in communication with the electronic circuit.

36. An alarm system according to any one of clauses 30 to 35, wherein the alarm unit comprises at least one speaker adapted to create an audio element of the alarm.

37. An alarm system according to any one of clauses 30 to 36, wherein the alarm unit comprises at least one LED light adapted to create a visual element of the alarm.

38. An alarm system according to any one of clauses 30 to 37, wherein the alarm system is configured to be activated when the sensor senses no magnetic field from the magnet or a magnetic field below a predetermined strength.

39. An alarm system according to clause 38, wherein the alarm system is adapted to calculate the pre-determined period of time as commencing when the sensor has sensed no magnetic field from the magnet or a magnetic field below a predetermined strength.

40. A method of raising an alarm to indicate that a latch of a latch assembly has been in an unlatched condition after a predetermined period of time, the method comprising:
  sensing when the latch is in the unlatched condition;
  waiting for a predetermined period of time; and
  if during the predetermined period of time the latch remains in the unlatched condition, creating an alarm.

41. A method according to clause 40, wherein the method comprises continuing the alarm for an alarm time interval if the latch remains in the unlatched condition.

42. A method according to clause 40 or 41, wherein the method comprises creating the alarm for periodic alarm time intervals if the latch remains in the unlatched condition.

43. A method according to clause 42, wherein the alarm ceases between the periodic alarm time intervals.

44. A method according to clause 42 or 43, wherein each successive alarm time interval is of increased duration than the previous alarm time interval.

45. A method according to any one of clauses 42 to 44, wherein each successive alarm time interval is of increased intensity than the previous alarm time interval.

46. A method according to any one of the clauses 40 to 45, wherein the method comprises increasing the intensity of the alarm over time if the latch remains in the unlatched condition.

47. A method according to any one of clauses 40 to 46, wherein sensing when the latch is in an unlatched condition comprises providing a sensor adapted to sense a magnetic field imparted by a magnet in the latch assembly to distinguish whether the latch is in a latched or unlatched condition.

48. A method according to clause 47, wherein the method comprises commencing the pre-determined period of time when the sensor senses no magnetic field from the magnet.

49. A method according to any one of clauses 40 to 48, wherein the alarm comprises an audio element, a visual element or a combination of both.

50. A method according to any one of clauses 40 to 49, wherein the method comprises selectively increasing the pre-determined period of time after the pre-determined period of time has commenced.

The invention claimed is:
1. A latch assembly comprising:
    a latch operative to adopt a latched condition and an unlatched condition;
    a magnet imparting a magnetic field;
    a sensor adapted to sense the magnetic field;
    the latch, magnet and sensor being configured such that a change in the condition of the latch effects a variance in the magnetic field sensed by the sensor such that the sensor is able to distinguish between the latched condition and the unlatched condition,
    wherein the latch includes a latch member that is moveable relative to both the sensor and the magnet when the latch changes from the unlatched condition to the latched condition,
    wherein the latch comprises a first component which is arranged to be mounted to a movable barrier or surrounding structure and a second component arranged to be mounted on the other of the movable barrier or the surrounding structure, the first component and the second component configured to co-operate to hold the movable barrier in a closed position in the latching condition, and wherein when in the latched condition, the latch member is closer to the magnet than in the unlatched condition and wherein the proximity of the latch member to the magnet changes the strength of the magnetic field sensed by the sensor,
    wherein the latch member is biased into a retracted position and movable from the retracted position to an engaging position, and wherein when the components are in juxtaposition for latching in the closed position, the latch is arranged to adopt the latching condition by the latch member being caused to be moved against the bias from the retracted position to the engaging position by magnetic attraction between the latch member and the magnet, wherein the latch member establishes engagement with the second component,
    wherein the sensor is located on the first component and the magnet is located on the second component.

2. The latch assembly according to claim 1, wherein the sensor senses the magnetic field from the latch member.

3. The latch assembly as claimed in claim 1, wherein the magnet is adapted such that movement of the latch into the latched condition is induced by the magnetic field imparted by the magnet.

4. The latch assembly as claimed in claim 1, wherein the strength of the magnetic field sensed by the sensor causes the sensor to adopt one of an open or a closed position.

5. The latch assembly as claimed in claim 1, wherein the first component may include the latch member and the second component includes the magnet.

6. The latch assembly as claimed in claim 1, further comprising a ferrite element adapted such that movement of the ferrite element effects a change in the impact of the magnetic field on the sensor.

7. The latch assembly as claimed in claim 6, wherein movement of the ferrite element adjusts the sensitivity at which the sensor operates between the open and closed positions in response to the strength of the magnetic field.

8. The latch assembly as claimed in claim 6, wherein the ferrite element is moveably mounted with respect to the sensor such that movement of the ferrite element effects a change in the sensitivity of the sensor.

9. The latch assembly as claimed in claim 8, wherein the ferrite element is positioned adjacent to or juxtaposed with the sensor.

10. The latch assembly as claimed in claim 6, wherein the ferrite element is moveably mounted in relation to the sensor, the ferrite element being moveable between a position in which more of the ferrite element is proximal the sensor and a position in which less of the ferrite element is proximal the sensor.

11. The latch assembly as claimed in claim 10, wherein the ferrite element is slideably mounted in relation to the sensor.

12. The latch assembly as claimed in claim 6, wherein the ferrite element is movably mounted on the first component.

13. The latch assembly as claimed in claim 1, further comprising an indicator adapted to warn a user that the latch is in its unlatched condition for a predetermined period of time.

14. The latch assembly as claimed in claim 13, wherein the indicator comprises an audible and/or visual alarm.

15. The latch assembly as claimed in claim 13, wherein the sensor comprises a reed switch.

16. A latch assembly comprising:
    a latch operative to adopt a latched condition and an unlatched condition;
    a magnet imparting a magnetic field;
    a sensor adapted to sense the magnetic field;
    the latch, magnet and sensor being configured such that a change in the condition of the latch effects a variance in the magnetic field sensed by the sensor such that the sensor is able to distinguish between the latched condition and the unlatched condition,
    wherein the latch includes a latch member that is moveable relative to both the sensor and the magnet when the latch changes from the unlatched condition to the latched condition,
    wherein the latch comprises a first component which is arranged to be mounted to a movable barrier or surrounding structure and a second component arranged to be mounted on the other of the movable barrier or the surrounding structure, the first component and the second component configured to co-operate to hold the movable barrier in a closed position in the latching condition, and wherein when in the latched condition, the latch member is closer to the magnet than in the unlatched condition and wherein the proximity of the latch member to the magnet changes the strength of the magnetic field sensed by the sensor,
    wherein the latch member is biased into a retracted position and movable from the retracted position to an engaging position, and wherein when the components are in juxtaposition for latching in the closed position, the latch is arranged to adopt the latching condition by the latch member being caused to be moved against the bias from the retracted position to the engaging position by magnetic attraction between the latch member and the magnet, wherein the latch member establishes engagement with the second component, wherein the sensor senses the magnetic field from the latch member.

17. The latch assembly as claimed in claim 16, wherein the magnet is adapted such that movement of the latch into the latched condition is induced by the magnetic field imparted by the magnet.

18. The latch assembly as claimed in claim 16, wherein the strength of the magnetic field sensed by the sensor causes the sensor to adopt one of an open or a closed position.

19. The latch assembly as claimed in claim 16, wherein the first component may include the latch member and the second component includes the magnet.

20. A latch assembly comprising:
- a latch operative to adopt a latched condition and an unlatched condition;
- a magnet imparting a magnetic field;
- a sensor adapted to sense the magnetic field;
- the latch, magnet and sensor being configured such that a change in the condition of the latch effects a variance in the magnetic field sensed by the sensor such that the sensor is able to distinguish between the latched condition and the unlatched condition,
- wherein the latch includes a latch member that is moveable relative to both the sensor and the magnet when the latch changes from the unlatched condition to the latched condition,
- wherein the latch comprises a first component which is arranged to be mounted to a movable barrier or surrounding structure and a second component arranged to be mounted on the other of the movable barrier or the surrounding structure, the first component and the second component configured to co-operate to hold the movable barrier in a closed position in the latching condition, and wherein when in the latched condition, the latch member is closer to the magnet than in the unlatched condition and wherein the proximity of the latch member to the magnet changes the strength of the magnetic field sensed by the sensor,
- wherein the latch member is biased into a retracted position and movable from the retracted position to an engaging position, and wherein when the components are in juxtaposition for latching in the closed position, the latch is arranged to adopt the latching condition by the latch member being caused to be moved against the bias from the retracted position to the engaging position by magnetic attraction between the latch member and the magnet, wherein the latch member establishes engagement with the second component,
- wherein the sensor forms of part of a latch sensor system,
- wherein the latch sensor system is mounted to the first component.

* * * * *